US009047053B2

(12) United States Patent
Gao et al.

(10) Patent No.: US 9,047,053 B2
(45) Date of Patent: Jun. 2, 2015

(54) CONDUCTIVE FILM, METHOD FOR MANUFACTURING THE SAME AND TOUCH SCREEN HAVING THE SAME

(71) Applicant: NANCHANG O-FILM TECH. CO., LTD., Jiangxi (CN)

(72) Inventors: Yulong Gao, Jiangxi (CN); Zhao He, Jiangxi (CN)

(73) Assignee: Nanchang O-Film Tech. Co., Ltd., Jiangxi (CN)

( * ) Notice: Subject to any disclaimer, the term of this patent is extended or adjusted under 35 U.S.C. 154(b) by 179 days.

(21) Appl. No.: 13/985,985

(22) PCT Filed: Jul. 8, 2013

(86) PCT No.: PCT/CN2013/078985
§ 371 (c)(1),
(2) Date: Aug. 16, 2013

(87) PCT Pub. No.: WO2014/121586
PCT Pub. Date: Aug. 14, 2014

(65) Prior Publication Data
US 2014/0218635 A1 Aug. 7, 2014

(51) Int. Cl.
*H05K 1/09* (2006.01)
*G06F 1/16* (2006.01)
*G06F 3/044* (2006.01)

(52) U.S. Cl.
CPC ............... *G06F 1/1643* (2013.01); *H05K 1/09* (2013.01); *G06F 3/044* (2013.01); *G06F 2203/04103* (2013.01)

(58) Field of Classification Search
CPC ........................................................ H05K 1/09
USPC ............... 174/392, 257; 345/173; 361/679.21
See application file for complete search history.

(56) References Cited

U.S. PATENT DOCUMENTS 8,227,712 B2 * 7/2012 Seo et al. ........................ 174/381
2003/0013048 A1 * 1/2003 Gilson ............................. 430/321
(Continued)

FOREIGN PATENT DOCUMENTS

CN 201212990 Y 3/2009
CN 101859213 A 10/2010
(Continued)

OTHER PUBLICATIONS

Communication From the Chinese Patent Office Regarding a Counter-Part Foreign Application Date Dec. 12, 2013.
Communication From the Korean Patent Office Regarding a Counter-Part Foreign Application Date Dec. 1, 2014.
(Continued)

*Primary Examiner* — Hung V Ngo
(74) *Attorney, Agent, or Firm* — Rosenberg, Klein & Lee

(57) ABSTRACT

A conductive film is disclosed in the present disclosure, which includes: a substrate having a first surface and a second surface opposite to each other; and a first conductive layer laid on the first surface, the first conductive layer includes a plurality of first conductive areas and first insulating areas, the first conductive areas include a metal mesh formed by a metal, the first insulating areas include an insulating mesh formed by an insulating metal sulfide, the insulating metal sulfide is obtained from a reaction between the metal and hydrogen sulfide. Accordingly, the problem of producing lots of wastewater of the metal salts and heavy metal pollution can be avoided, the insulating areas include the insulating mesh having a transmittance close to the metal mesh, benefit for reach a uniform transmittance of the touch screen, and avoid forming alternating light and dark color patches.

20 Claims, 12 Drawing Sheets

(56) References Cited

U.S. PATENT DOCUMENTS

| | | | |
|---|---|---|---|
| 2004/0000416 A1* | 1/2004 | Hou | 174/35 MS |
| 2004/0074655 A1* | 4/2004 | Takahashi et al. | 174/35 MS |
| 2008/0277157 A1* | 11/2008 | Naito et al. | 174/392 |
| 2010/0164358 A1* | 7/2010 | Lee et al. | 313/313 |
| 2010/0261119 A1 | 10/2010 | Li et al. | |
| 2013/0078436 A1 | 3/2013 | Naito et al. | |
| 2013/0189502 A1 | 7/2013 | Takahashi et al. | |
| 2013/0242485 A1 | 9/2013 | Ohtani et al. | |
| 2014/0078416 A1* | 3/2014 | Kim | 349/12 |
| 2014/0151098 A1* | 6/2014 | Hwang et al. | 174/257 |

FOREIGN PATENT DOCUMENTS

| | | |
|---|---|---|
| CN | 102723126 A | 10/2012 |
| CN | 102903423 A | 1/2013 |
| CN | 103021532 A | 4/2013 |
| JP | 2012-103761 A | 5/2012 |
| JP | 2012-181816 A | 9/2012 |
| KR | 10-2012-0018059 A | 2/2012 |

OTHER PUBLICATIONS

Communication From the Chinese Patent Office Regarding a Counter-Part Foreign Application Date Mar. 25, 2014.

* cited by examiner

CONDUCTIVE FILM, METHOD FOR MANUFACTURING THE SAME AND TOUCH SCREEN HAVING THE SAME

FIELD OF THE INVENTION

The present disclosure relates to a field of touch screen, and more particularly relates to a conductive film, a method for manufacturing the conductive film and a touch screen having the conductive film.

BACKGROUND OF THE INVENTION

The touch screen is a sensing device capable of receiving a touch input signal. The touch screen brings a new appearance for information exchange; which is a new appealing interactive device with new information. The development of touch screen technology has aroused widespread concern from information media on home and abroad, which has become an abruptly rise and booming high-tech industries in the opto-electronics.

The conductive layer is a vital component of the touch screen module. The manufacturing technology of touch screen has been rapid developed. However, taking projected capacitive screen as an example, the basic manufacturing process of the conductive layer has not been changed too much recently. The forming and patterning of the conductive layer and the manufacturing of silver electrode trace are always inevitably needed. Besides, the procedures of exposure, development, etching, and cleaning and others for patterning the transparent conductive layer are also inevitably needed. In the etching process, an unnecessary area of the conductive layer is usually etched, thereby a fixed conductive area and a blank area are formed on the surface of the substrate, and the conductive area has a specific shape.

However, the light transmittance is attenuated due to the additional shading ratio of the conductive area, and the blank area of the insulating area has no attenuation of the light transmittance similar to the conductive area, such that the light transmittance of the insulating area is greater than that of the conductive area in the conductive film, and the alternating light and dark color patches are then formed on the conductive film.

SUMMARY OF THE DISCLOSURE

The present disclosure is directed to provide a conductive film which can avoid the formation of the alternating light and dark color patches, a method for manufacturing the conductive film and a touch screen with the conductive film.

According to an aspect of the present disclosure, a conductive film is provided, which includes:

a substrate having a first surface and a second surface opposite to each other; and a first conductive layer disposed on the first surface of the substrate, the first conductive layer includes a plurality of first conductive areas and a plurality of first insulating areas, one of the first insulating areas being located between two adjacent first conductive areas, the first conductive areas include a metal mesh formed by a metal, the first insulating areas include an insulating mesh formed by an insulating metal sulfide, the insulating metal sulfide is obtained from a reaction between the metal and hydrogen sulfide.

In one embodiment, the first conductive layer is directly positioned on the first surface of the substrate.

In one embodiment, the first surface of the substrate is provided with a first substrate layer, the first conductive layer is embedded in the first substrate layer.

In one embodiment, the first substrate layer defines a first groove on a surface thereof away from the substrate; the first conductive layer is received in the first groove.

In one embodiment, the first surface of the substrate defines a first groove; the first conductive layer is received in the first groove.

In one embodiment, the first conductive area includes a first axial conductive column and a second conductive column, the first axial conductive column includes a first axial conductive unit and a first connecting portion electrically connected to the first axial conductive unit, the second conductive column includes a second axial conductive unit and a second connecting portion electrically connected to the second axial conductive unit, an insulation element is disposed between the first connecting portion and the second connecting portion, the first connecting portion is insulated to the second connecting portion via the insulation element.

In one embodiment, the conductive film further includes a second conductive layer, the second conductive layer and the first conductive layer being spaced and insulated from each other in the thickness direction of substrate, wherein the second conductive layer includes a plurality of second conductive areas and a plurality of second insulating areas, one of the second insulating areas is located between two adjacent second conductive areas, the second conductive area includes a metal mesh formed by metal, the second insulating area includes an insulating mesh formed by the insulating metal sulfide, the insulating metal sulfide is obtained from a reaction between the metal and hydrogen sulfide.

In one embodiment, the conductive film further includes a second substrate layer embedded in the second substrate layer.

In one embodiment, the first conductive layer is covered with the second substrate layer located between the first conductive layer and the second conductive layer; the second substrate layer, the first conductive layer and the second conductive layer are located at the same side of the substrate; a surface of the second substrate layer away from the substrate defines a second groove, the second conductive layer is received in the second groove.

In one embodiment, the second substrate layer is disposed on the second surface of the substrate, a surface of the second substrate layer away from the substrate defines a second groove; the second conductive layer is received in the second groove.

In one embodiment, the second surface of the substrate defines a second groove; the second conductive layer is received in the second groove.

According to an aspect of the present disclosure, a touch screen is provided, which includes a transparent panel, an electrode trace, and a conductive circuit, the touch screen further includes the above conductive film; a surface of the first conductive layer is covered with the transparent panel, the electrode trace is connected to the metal mesh of the first conductive area of the first conductive layer, the conductive trace is connected to the electrode trace.

According to an aspect of the present disclosure, a touch screen is provided, which includes a transparent panel, an electrode trace, and a conductive circuit, wherein the touch screen further includes the above conductive film, a surface of the first conductive layer is covered with the transparent panel, the electrode trace includes a first electrode trace and a second electrode trace, the first electrode trace and the second electrode trace are spaced from each other in the thickness direction of the substrate, the first electrode trace is connected to the metal line of the metal mesh of the first conductive layer, the second electrode trace is connected to the metal line of the metal mesh of the second conductive layer, the conductive trace is connected to the electrode trace.

According to an aspect of the present disclosure, a method for manufacturing a conductive film is provided, which includes the following steps:

providing a substrate having a first surface and a second surface opposite to each other;

laying a metal mesh on the first surface of the substrate to form a first conductive layer;

pattern masking a surface of the first conductive layer to form a protective layer, an area covered with the protective layer being a first conductive area, an area not covered with the protective layer being a first insulating area;

oxidizing the first conductive layer to oxidize the metal mesh which is not covered with the protective layer; and placing the metal mesh in an environment containing $H_2S$, reacting the metal mesh of the first insulating area and the $H_2S$ to obtain an insulating metal sulfide, forming a insulating mesh, and obtaining the conductive film.

In one embodiment, the formation of the metal mesh includes the following steps:

imprinting the substrate to form a first groove;

filling a metal slurry in the first groove and sintering to form the metal mesh and obtain the first conductive layer.

In one embodiment, the formation of the metal mesh includes the following steps:

coating the first surface of the substrate to form a first substrate layer;

imprinting the first substrate layer to form a first groove;

filling and sintering a metal slurry in the first groove to form the metal mesh embedded in the first substrate layer and obtain the first conductive layer.

In one embodiment, the formation of the metal mesh includes the following steps:

coating a nano-metal slurry on the first surface of the substrate;

curing the substrate to dry a solvent in the nano-metal slurry coated on the first surface, connecting a plurality of nano-metal lines of the nano-metal slurry to each other to form the first conductive layer;

compacting the first conductive layer to connect the nano-metal lines of the nano-metal slurry to each other to form the first metal mesh.

In one embodiment, the method for manufacturing the conductive film further includes a step of laying a second conductive layer after placing the metal mesh in an environment containing $H_2S$, the step of laying the second conductive layer includes the following steps:

laying a metal mesh on the first conductive layer or the second surface of the substrate to form the second conductive layer;

pattern masking a surface of the second conductive layer to form a protective layer, an area covered with the protective layer being a second conductive area, an area not covered with the protective layer being a second insulating area;

oxidizing the second conductive layer to oxidize metal mesh not covered with the protective layer;

placing the metal mesh of the second insulating area in an environment containing $H_2S$, the metal mesh of the second insulating area and the $H_2S$ reacting to obtain an insulating metal sulfide, forming an insulating mesh, and obtaining a conductive film including the second conductive area consisted of the metal mesh and the second insulating area consisted of the non-conductive metal sulfide mesh.

In one embodiment, an oxidation of the first conductive layer and the second conductive layer after the pattern masking includes the following steps:

placing the first conductive layer and the second conductive layer in an oxidizing atmosphere, the oxidizing atmosphere is selected from the group consisted of hydrogen peroxide, dilute nitric acid, hot concentrated sulfuric acid, and hydrochloric acid;

or coating an oxidizing material on the first conductive layer and the second conductive layer, forming a first insulating area and a second insulating area.

In one embodiment, the protective layer is formed by coating a photoresist, ink-jet printing or pattern screen printing.

DETAILED DESCRIPTION OF THE EMBODIMENTS

Reference will now be made to the drawings to describe, in detail, embodiments of the present conductive film and the method for manufacturing the conductive film and the touch screen having the conductive film.

Figure 1:
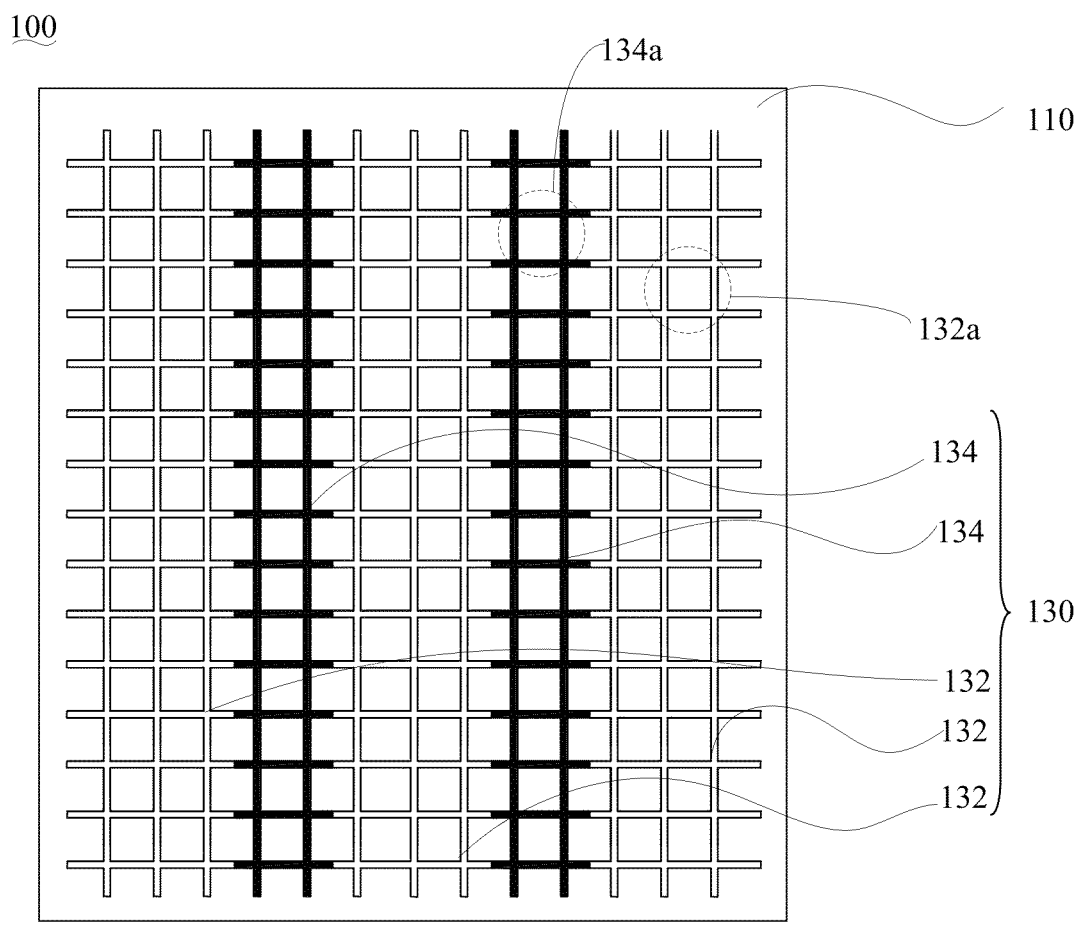
FIG. 1 is a schematic view of a conductive film according to a first embodiment.
Figure 2:
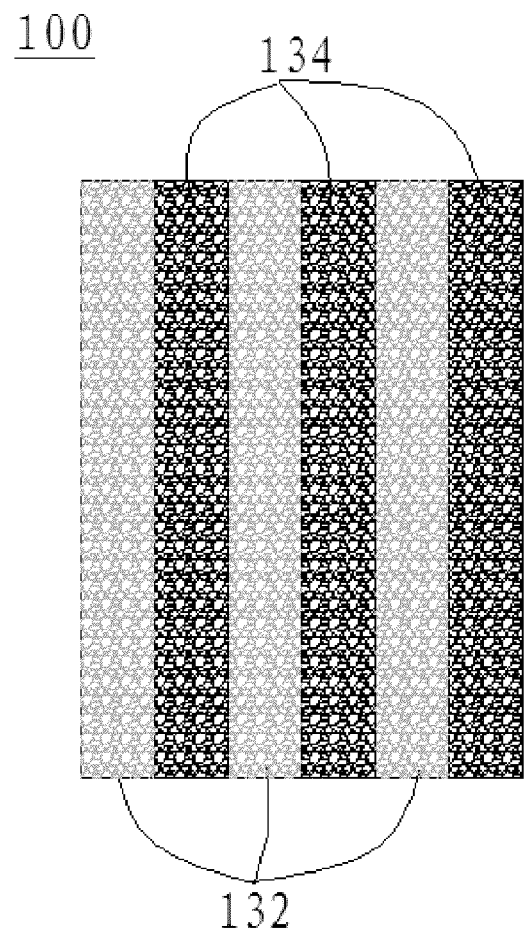
FIG. 2 is a schematic view of the conductive film according to the first embodiment viewed from another aspect.
Figure 3:
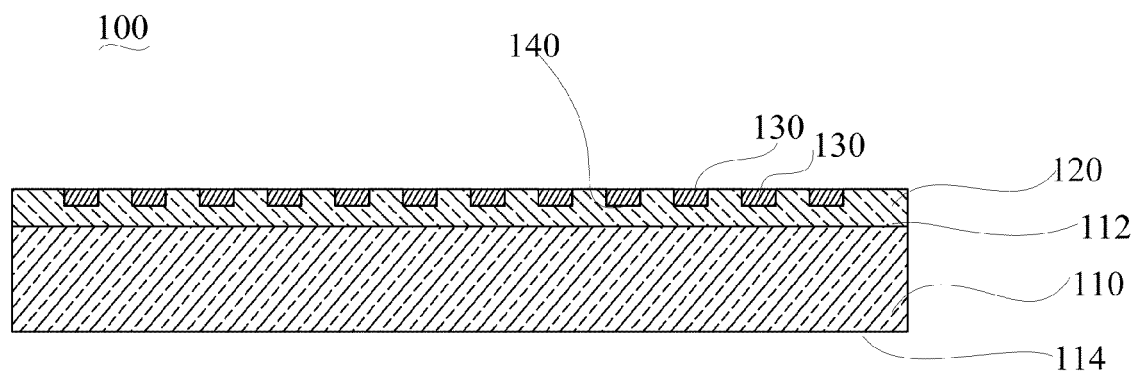
FIG. 3 is a schematic view of the conductive according to the first embodiment viewed from another aspect.

In the first embodiment shown in FIG. 1 to FIG. 3, a conductive film 100 includes a substrate 110, a first substrate layer 120, a first conductive layer 130, and a first groove 140. The substrate 110 includes a first surface 112 and a second surface 114, which are opposite to each other. The first surface 112 is covered with the first substrate layer 120, the second surface 114 is usually bonded to a shielding layer or a screen to form a touch screen. The first groove 140 is defined on the surface of the first substrate layer 120 away from the first surface 112. The first conductive layer 130 is received in the first groove 140 to form an embedded mesh. The first conductive layer 130 includes a plurality of first conductive areas 132 and a plurality of first insulating areas 134. One of the first insulating areas 134 is located between two adjacent first conductive areas 132. The first conductive areas 132 include a metal mesh 132*a* formed by a metal, the first insulating areas 134 include an insulating mesh 134*a* formed by an insulating metal sulfide, which is obtained from a reaction between the metal and hydrogen sulfide.

In the conductive film 100, the first conductive layer 130 includes the first conductive areas 132 and the first insulating areas 134, and the first conductive areas 132 are formed by the metal mesh 132*a*, the first insulating areas 134 are formed by the insulating mesh 134*a* obtained from a reaction between the metal and hydrogen sulfide, therefore, the first insulating areas 134 are not blank, they are formed by the insulating mesh 134*a* having a transmittance close to the metal mesh 132*a*, thus it helps to reach a uniform transmittance of the touch screen. It can also avoid the alternating light and dark color patches formed by the first conductive areas 132 and the first insulating areas 134, cooperatively; thus improving the user experience.

In alternative embodiments, the first groove 140 can be directly defined on the first surface 112 of the substrate 110; the first conductive layer 130 is received in the first groove 140 to form an embedded mesh. Accordingly, the first substrate 120 is not necessary. The first conductive areas 132 and the first insulating areas 134 are cooperatively formed an embedded mesh, which helps to save metal materials and manufacturing costs. Moreover, when a distance of lines of the first conductive areas 132 and the first insulating areas 134 ranges from 10 μm to 20 μm, it can satisfy a visual transparency. The first substrate 120 is used for insulating and molding.

In alternative embodiments, the first groove 140 can be omitted, a plurality of intercrossing metal meshes 132*a* can be directly disposed on the first surface 112 of the substrate 110, the metal meshes 132*a* are formed by a plurality of intercrossing metal lines. The step of defining a groove is omitted, and any pattern can be obtained via compacting the formed the metal meshes 132*a* on the first surface 112 of the substrate 110.

Specifically, the metal of first conductive areas 132 can be any one selected form the group consisting of gold, silver, copper, aluminum, and zinc or an alloy consisted of at least two of them. The costs can be reduced due to the material of gold, silver, copper, aluminum and zinc is relatively cheaper. In the illustrated embodiment, silver is mainly used to form the metal mesh.

Referring to FIG. 1 or FIG. 3, in the illustrated embodiment, the metal mesh 132*a* of the first conductive areas 132 adjacent to the insulating mesh 134*a* of the first insulating areas 134 may be complementary in the shape. Accordingly, the mesh type and density of both the first conductive areas 132 and the first insulating areas 134 are the same, such that the blank area may not appear between the first conductive areas 132 and the first insulating areas 134, and the alternating light and dark color patches may not appear due to the exact same transmittance. It is to be understood that, in alternative embodiments, the insulating mesh 134*a* of the first insulating areas 134 can be not complementary with the metal mesh 132*a* of the first conductive areas 132 in the shape, for example, an invisible blank area can be located between the insulating mesh 134*a* of the first insulating areas 134 and the metal mesh 132*a* of the first conductive areas 132, which can also achieve the purpose of the same transmittance. Alternatively, the insulating mesh 134*a* can be divided to form an invisible interval between the insulating mesh 134*a*, which can also achieve the purpose of the same transmittance. Accordingly, it is not necessary for the insulating mesh 134*a* of the first insulating areas 134 to be complementary with the metal mesh 132*a* of the first conductive areas 132 in the shape.

Specifically, in the first embodiment, a depth of the first groove 140 is greater than or equal to a thickness of the first conductive layer 130. In the process of imprinting the groove and filling metal slurry to form the metal conductive mesh lines, the solvent of the metal slurry will evaporate during the sintering of the metal slurry, such that the thickness of the first conductive layer 130 is less than the depth of the first groove 140.

In the first embodiment, the substrate 110 is made of terephthalate. In alternative embodiments, the substrate 110 can also be made of the other material, such as polybutylene terephthalate, polymethyl methacrylate, polycarbonate plastic or glass and others, preferably a transparent insulating material.

Figure 6:
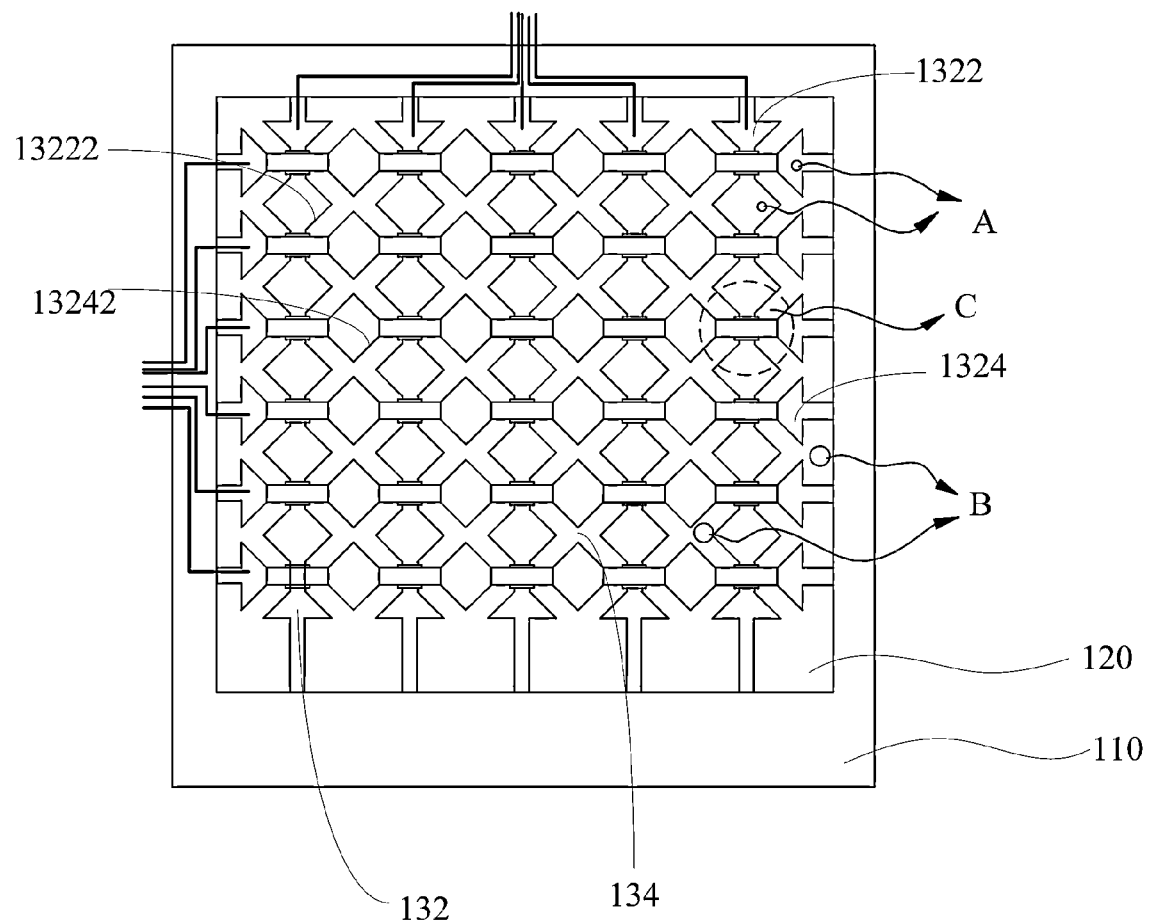
FIG. 6 is a schematic view of a conductive film according to another embodiment.
Figure 6A:
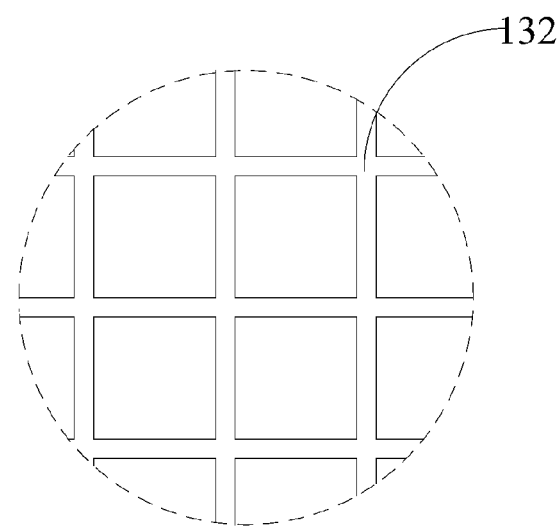
FIG. 6A is a partial, enlarged view of a circled portion A shown in FIG. 6.
Figure 6B:
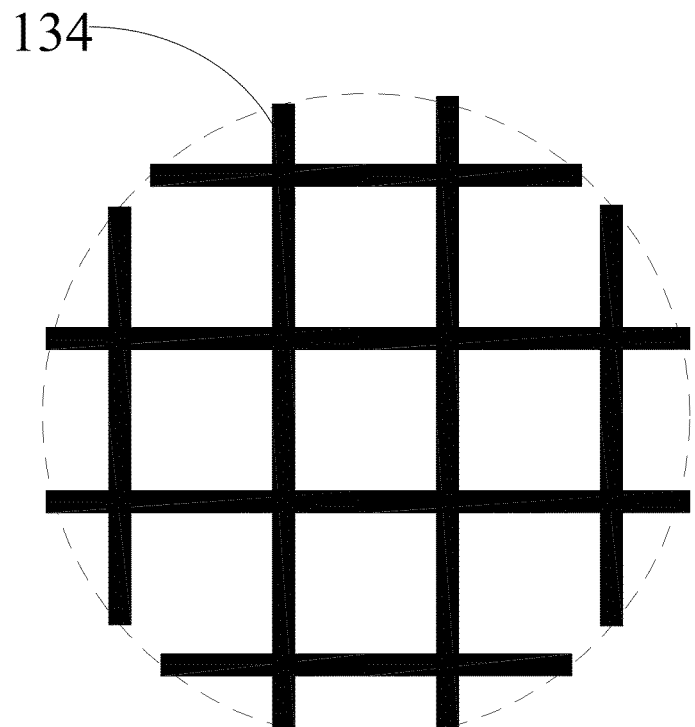
FIG. 6B is a partial, enlarged view of a circled portion B shown in FIG. 6.

Referring to FIG. 6, FIG. 6A and FIG. 6B, in an embodiment, the first conductive area 132 includes a first axial conductive column 1322 and a second conductive column 1324. The first axial conductive column 1322 includes a first axial conductive unit 13222 and a first connecting portion 13224 electrically connected to the first axial conductive unit 13222. The second conductive column 1324 includes a second axial conductive unit 13242 and a second connecting portion 13244 electrically connected to the second axial conductive unit 13242, an insulation element 1326 is configured between the first connecting portion 13224 and the second connecting portion 13244, the first connecting portion 13224 is insulated to the second connecting portion 13244 via the insulation element 1326. The Y-axis in two-dimensional coordinate system is regarded as the first axial conductive column 1322, and the X-axis is regarded as the second axial conductive column 1324. In the illustrated embodiment, the first axial conductive unit 13222 and the second axial conductive unit 13242 are rhombic mesh. It is to be understood that, alternatively, it can also be rectangular, square, rectangular and other shapes.

Figure 4:
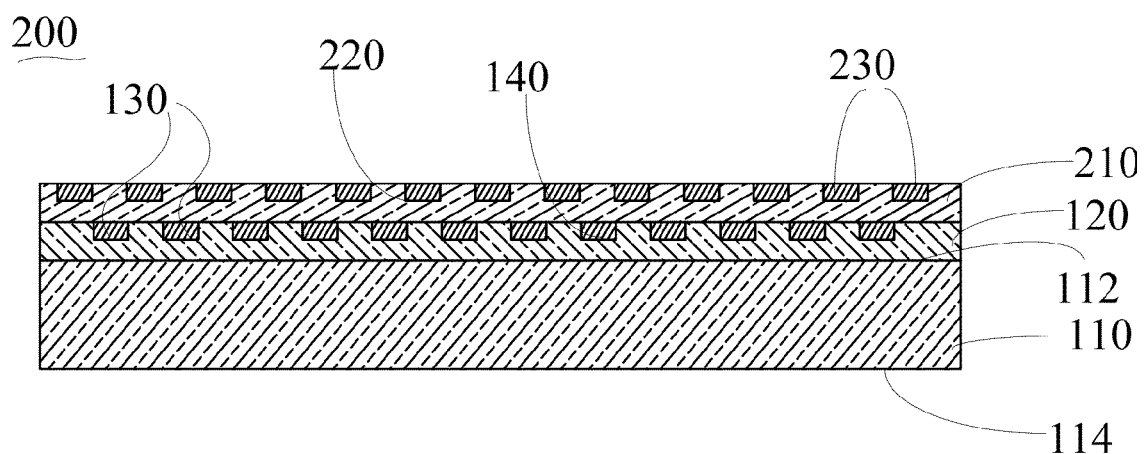
FIG. 4 is a schematic view of a conductive film according to another embodiment.
Figure 5:
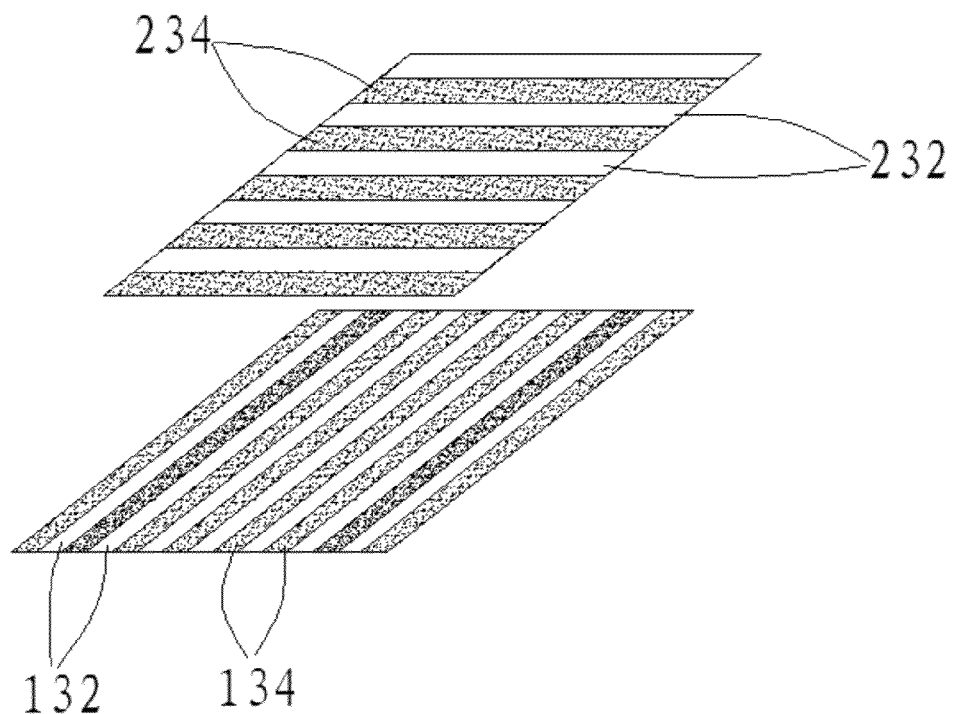
FIG. 5 is a schematic view of a conductive film according to another embodiment.

Referring to FIG. 4 and FIG. 5, in the second embodiment, a conductive film 200 includes the substrate 110, the first substrate layer 120, and the first conductive layer 130 shown in the FIG. 1 to FIG. 3; the conductive film 200 further includes a second substrate layer 210, a second groove 220, and a second conductive layer 230. The first conductive layer 130 is covered with the second substrate layer 210, and the second groove 220 is defined on the second substrate layer 210. The second conductive layer 230 is received in the second groove 220 to form an embedded mesh. The second conductive layer 230 includes a plurality of second conductive areas 232 and a plurality of second insulating areas 234, one of the second insulating areas 234 is located between two adjacent second conductive areas 232. The second conductive areas 232 includes a metal mesh 132*a* formed by a metal, the second insulating areas 234 includes an insulating mesh 134*a* formed by an insulating metal sulfide, which is obtained from a reaction between the metal hydrogen and sulfide. The second substrate layer 210, the first conductive layer 120, and the second conductive layer 230 are located at the same side of the substrate 110.

In the conductive film 200, both the first conductive layer 130 and the second conductive layer 230 include the conductive areas and the insulating areas, and the conductive areas are formed by the metal mesh 132a, the insulating areas are formed by the insulating mesh 134a obtained from a reaction between the metal and hydrogen sulfide, therefore, the insulating areas are not blank area, the insulating areas are covered with the insulating mesh 134a with a transmittance close to the metal mesh 132a, thus it helps to reach a uniform transmittance of the touch screen. It can also avoid the alternating light and dark color patches formed by the conductive areas and the insulating areas, cooperatively; which can guarantee the transmittance of the first conductive layer 130 and the second conductive layer 230 are in a uniform; thus improving the user experience.

In the second embodiment, the metal material is the same as that in the first embodiment, which are both selected from a group consisting of gold, silver, copper, aluminum, and zinc or an alloy thereof, and the depth of the groove is greater than or equal to the thickness of the conductive layer, which will not described in detail.

The substrate 110 of the second embodiment is the same as that of the first embodiment; which will not described in detail.

In the second embodiment, both the first substrate layer 120 and the second substrate layer 210 are made of transparent insulating material and different from the substrate 110 and used for the molding of the metal mesh. The first substrate layer 120 and second substrate layer 210 can be made of UV curing adhesive, i.e. solvent-free UV curing acrylic resin. In alternative embodiments, the UV curing adhesive can be other component, but usually contain prepolymer, monomers, photoinitiators and additive, the ratio of each component is: 30% to 50%: 40% to 60%:1% to 6%:0.2% to 1%. The prepolymer can be selected from the group consisting of epoxy acrylate, urethane acrylate, polyether acrylate, polyester acrylate, and acrylic resin and so on; the monomers can be selected from the group consisting of monofunctional, difunctional and trifunctional, and polyfunctional; the photoinitiators can be selected from the group consisting of benzophenone, and deoxybenzoin and so on; the additive can be used or not, it usually be used as an adhesive, the common additives can be selected from the group consisting of hydroquinone, p-methoxyphenol, p-benzoquinone, and 2,6-di-tert-butyl-methylphenol and so on.

In alternative embodiments, the first substrate layer 120 and the second substrate layer 210 can be selected from one of the group consisting of light curing adhesive, thermosetting adhesive, and self-curing adhesive, and so on. A mesh-like groove for receiving the second conductive layer 230 is formed on the first substrate layer 120. The substrate 110 and the first substrate layer 120 are preferably made of high material, the transmittance of which is more than 85%.

In alternative embodiments, the second conductive layer 230 can be positioned on the second surface 114 of the substrate 110, i.e. the second conductive layer 230 can be received in the second groove 220 directly defined on the second surface 114, such that the second conductive layer 230 can also be positioned on the second surface 114, accordingly, the second substrate layer can be omitted.

In alternative embodiments, the second surface 114 of the substrate 110 did not configures the second groove 220, the intercrossing metal mesh 132a can be directly disposed on the second surface 114 of the substrate 110; the metal mesh 132a can be consisted by a plurality of intercrossing metal lines. The step of defining the second groove 220 is omitted, and any pattern can be obtained via compacting the formed metal meshes 132a on the second surface 114 of the substrate 110.

Figure 6C:
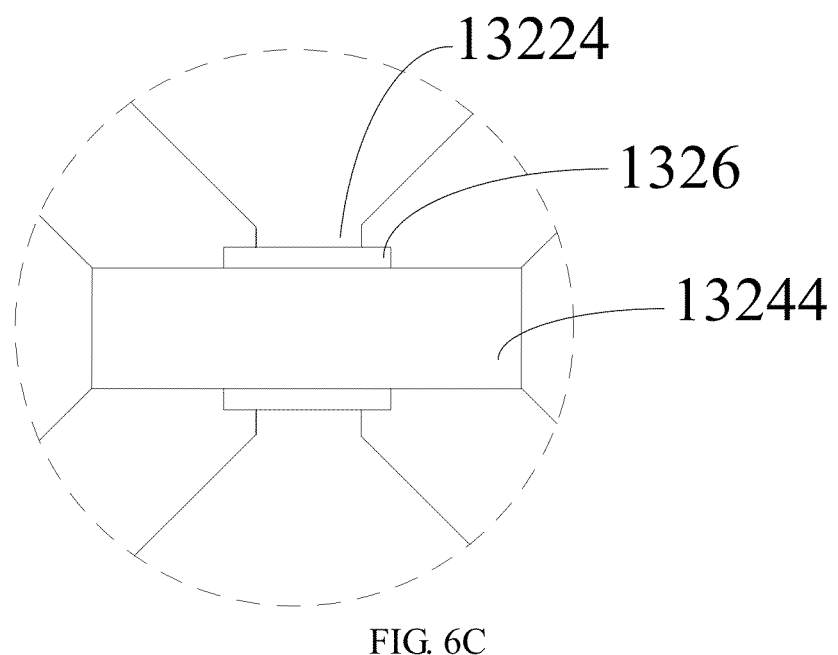
FIG. 6C is a partial, enlarged view of a circled portion C shown in FIG. 6.
Figure 7:
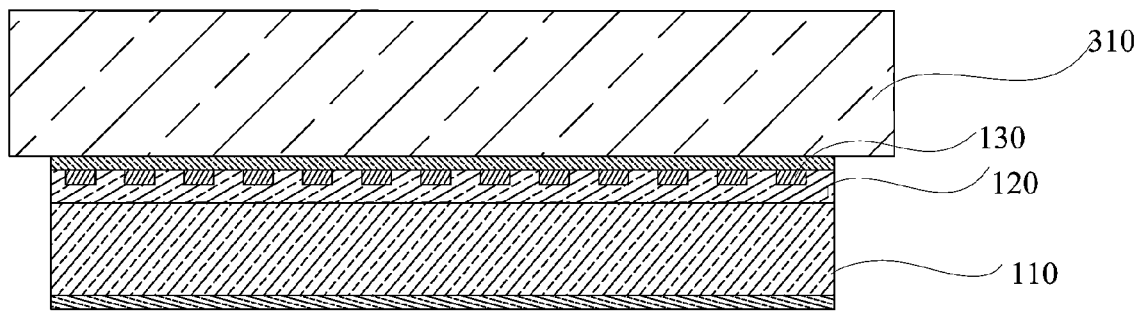
FIG. 7 is a schematic view of the conductive film shown in FIG. 6 applied to a touch screen.
Figure 8:
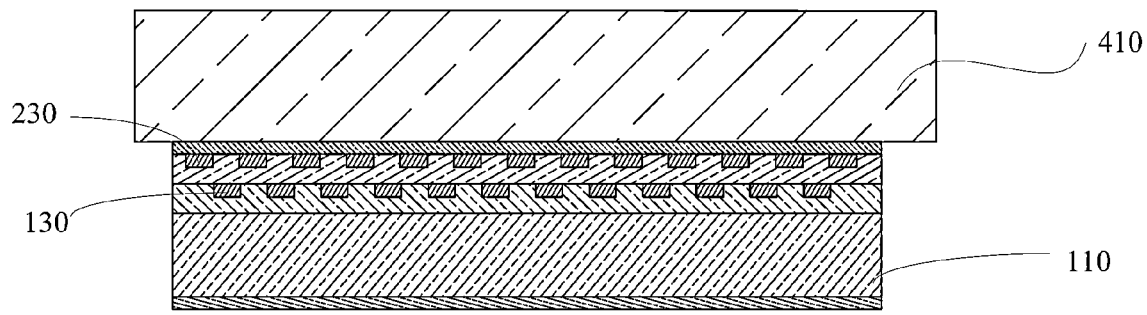
FIG. 8 is a schematic view of a conductive film applied to a touch screen according to another embodiment.
Figure 9:
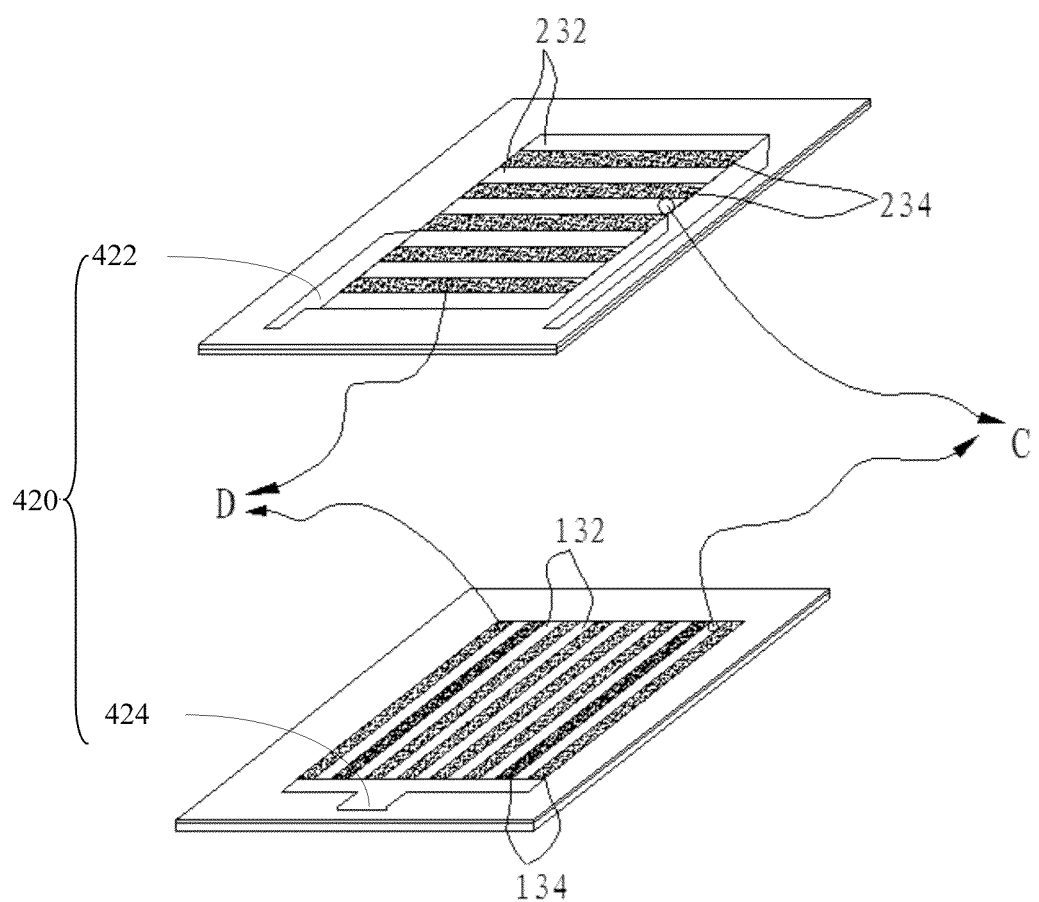
FIG. 9 is another schematic view of a conductive film applied to a touch screen according to another embodiment.
Figure 9A:
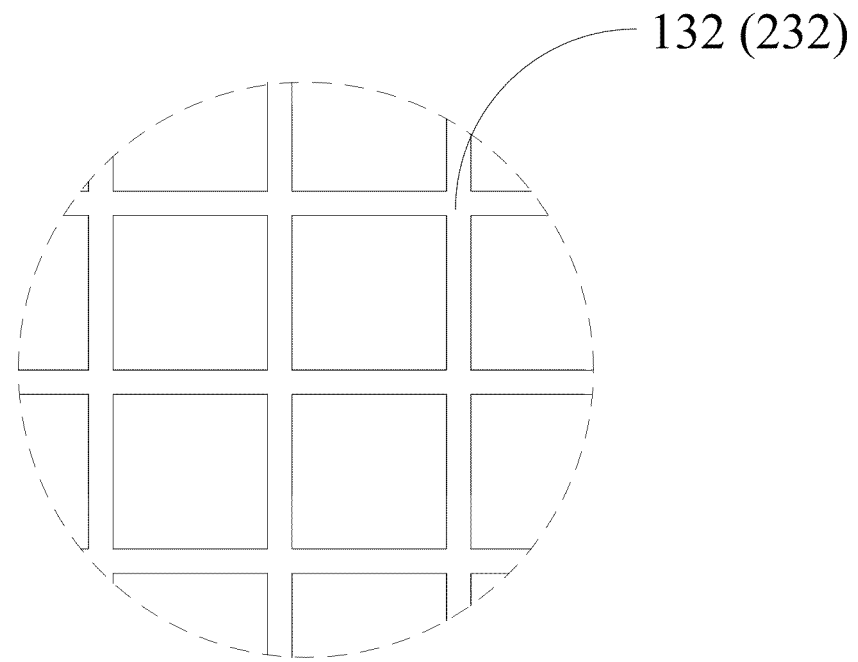
FIG. 9A is a partial, enlarged view of a circled portion C shown in FIG. 9.
Figure 9B:
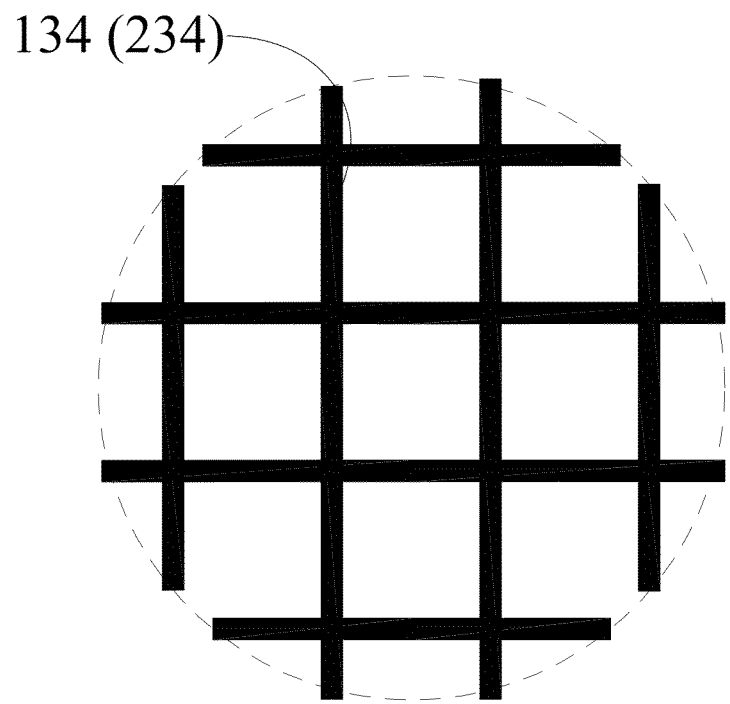
FIG. 9B is a partial, enlarged view of a circled portion D shown in FIG. 9.

Referring to FIG. 6 and FIG. 7, which show a touch screen according to the first embodiment, a touch screen 300 includes a transparent panel 310, the conductive film 100 shown in the FIG. 6 to FIG. 6C. A surface of the first conductive layer 130 is covered with the transparent panel 310.

In the touch screen 300, i.e. known as the multi-point touch screen. The transverse is defined as the X axis, the longitudinal is defined as the Y axis, the Y axis is the first axial conductive column 1322, and the X axis is the second conductive column 1324. The first conductive area 132 includes a first axial conductive column 1322 and a second conductive column 1324. The first axial conductive column 1322 includes a first axial conductive unit 13222 and a first connecting portion 13224 electrically connected to the first axial conductive unit 13222. The second conductive column 1324 includes a second axial conductive unit 13242 and a second connecting portion 13244 electrically connected to the second axial conductive unit 13242. An insulation element 1326 is configured between the first connecting portion 13224 and the second connecting portion 13244; the first connecting portion 13224 is insulated to the second connecting portion 13244 via the insulation element 1326. The first axial conductive column 1322 is defined as the sensing electrode of a touch screen; and the second conductive column 1324 is defined as the driving electrode of a touch screen. The area expect the first axial conductive column 1322 and the second conductive column 1324 is covered with the insulating areas 134 consisted by the insulating mesh 134a formed by a metal sulfide.

The first conductive layer 130 includes the first conductive areas 132 formed by the metal mesh 132a, the first insulating areas 134 are formed by the insulating mesh 134a obtained from a reaction between the metal and hydrogen sulfide, therefore, the first insulating areas 134 are not blank, they are formed by the insulating mesh 134a having a transmittance close to the metal mesh 132a, thus it helps to reach a uniform transmittance of the touch screen. It can also avoid the alternating light and dark color patches formed by the first conductive areas 132 and the first insulating areas 134, cooperatively; which can guarantee the transmittance of the first conductive layer 130 and the second conductive layer 230 are in a uniform; thus improving the user experience.

Referring to FIG. 8, FIG. 9, FIG. 9A and FIG. 9B, which show the touch screen according to the second embodiment, a touch screen 400 includes the conductive film 200 of the second embodiment shown in FIG. 4 and FIG. 5, a surface of the second conductive layer 230 is covered with the transparent panel 410. The electrode traces 420 include the first electrode traces 422 and a second electrode traces 424. The first electrode traces 422 and the second electrode traces 424 are spaced from each other in the thickness direction of the substrate 110. The first electrode traces 422 are connected to the metal line of the metal mesh 132a of the first conductive layer 130. The second electrode traces 424 are connected to the metal line of the metal mesh 132a of the second conductive layer 230. The conductive circuit is connected to the electrode traces 420.

In the case of not specifically specifying the first conductive area, the first insulating area, the second conductive area and the second area, the conductive area refers to the first conductive area and the second conductive area collectively, the insulating area refers the first insulating area and the second insulating area collectively.

In the touch screen 400, both the conductive areas and the insulating areas of the first conductive layer 130 and the second conductive layer 230 are configured as the strip-shaped, and the strip-shaped of the first conductive layer 130 and the strip-shaped of the second conductive layer 230 are perpendicular to each other. The conductive areas of the first conductive layer 130 and the second conductive layer 230 are led by the electrode traces 420, and the electrode traces 420 is connected to the conductive lines to form the sensing electrode and the driving electrode. Both the first conductive areas 132 and the second conductive areas 134 include the metal mesh 132a formed by the metal lines. Both the first insulating areas 134 and the second insulating areas 234 include the insulating mesh 134a formed by insulating metal sulfide, which is obtained from a reaction between the metal and hydrogen sulfide. Accordingly, the insulating areas are not blank area, the transmittance is reduced due to the shading of the metal mesh 132a, therefore, the insulating area is configured as the non-conductive insulating mesh 134a; thus it helps to reach a uniform transmittance of the touch screen. It can also avoid the alternating light and dark color patches formed by the conductive areas and the insulating areas, cooperatively; which can guarantee that the transmittance of the first conductive layer 130 and the second conductive layer 230 are in a uniform, thus improving the user experience.

Figure 10:
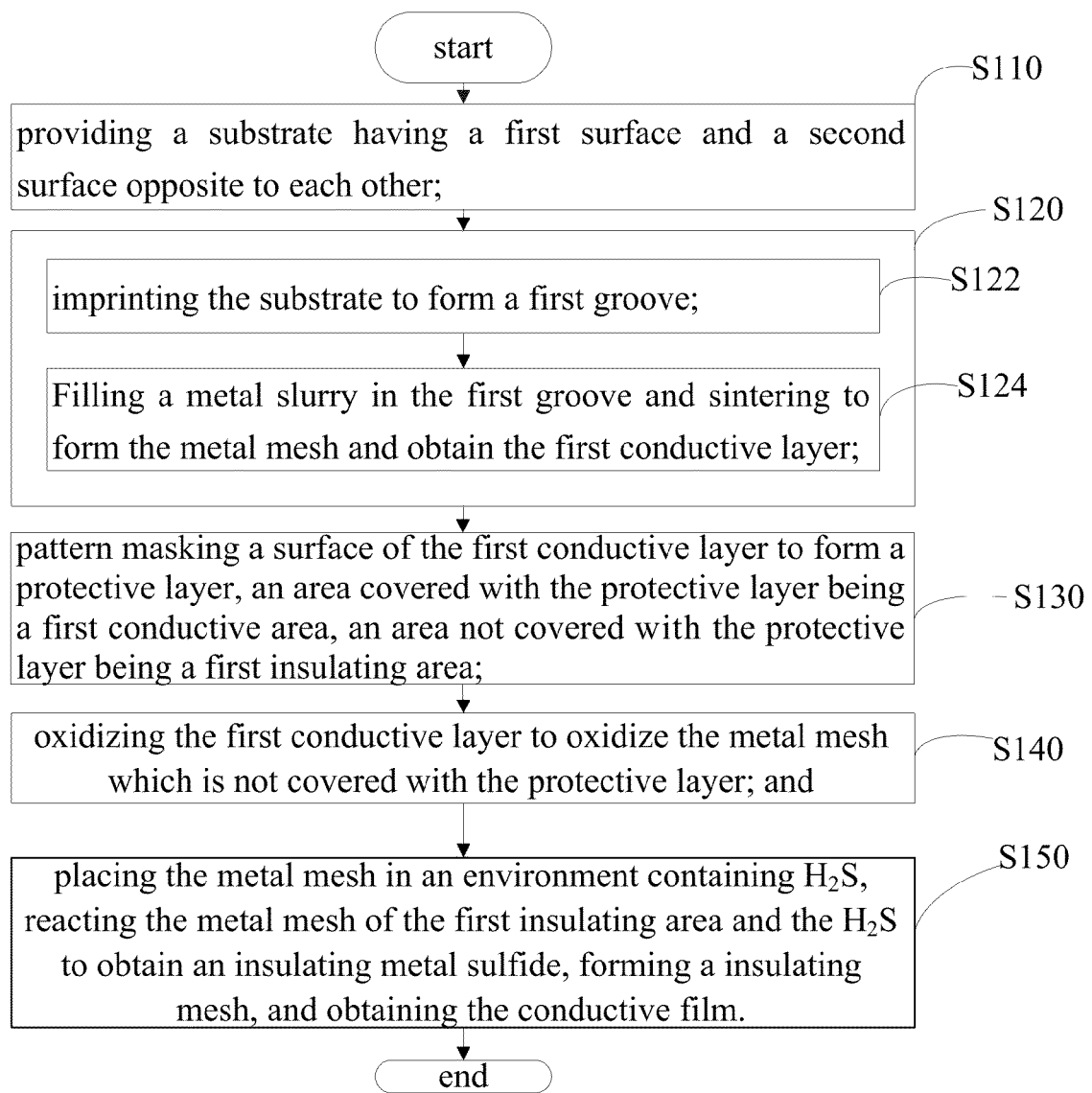
FIG. 10 is a flowchart of a method for manufacturing the conductive according to the first embodiment.

FIG. 10 shows a method for manufacturing a conductive film, the method for manufacturing a conductive film according to the first embodiment includes the following steps of:

Step S110, the substrate 110 is provided. The substrate 110 has a first surface 112 and a second surface 114 opposite to each other. The thickness of substrate 110 is 125 µm. The substrate 110 is made of terephthalate. In alternative embodiments, the substrate 110 can also be made of the other materials, such as polybutylene terephthalate, polymethyl methacrylate, polycarbonate plastic or glass and others, preferably a transparent insulating material.

Step S120, a metal mesh 132a is disposed on the first surface 112 of the substrate 110 to form a first conductive layer 130. Which specifically includes the following steps of: Step S122, the substrate 110 is imprinted to define the first groove 140. The shape of the first groove 140 is mesh-like, the depth of the first groove 140 is 3 µm; the width of the first groove 140 is 2.2 µm.

Step S124, metal slurry is filled in the first groove 140 and sintered to form the metal mesh 132a, the first conductive layer 130 is obtained. In the illustrated embodiment, the nano-silver ink is filled into the meshed groove through blade coating; and then sintered at a temperature of 150°, such that the silver in the nano-silver ink is sintered to form conductive silver lines. The solid content of the silver ink is 35%, the solvent is evaporated during sintering; the thickness of the conductive silver lines is less than the first groove 140.

Step S130, a protective layer is disposed on a surface of the first conductive layer 130 to pattern mask the first conductive layer 130, an area covered with the protective layer is the first conductive areas 132; an area not covered with the protective layer is a first insulating area 134. The first conductive areas 132 and the first insulating areas 134 are formed on the surface of the first conductive layer 130. The graphics of diamond mesh, square mesh, rectangular mesh and others can be formed after the patterning.

Step S140, the first insulating area 134 that is the first conductive layer not covered with the protective layer, is oxidized by an oxidation reaction.

Step S150, in an environment containing the $H_2S$, the first insulating area 134 of the first conductive layer 130 not covered with the protective layer and the $H_2S$ react to obtain a non-conductive insulating metal sulfide to form the first insulating areas 134, the conductive film with the first insulating areas 134 formed by the non-conductive insulating mesh 134a is obtained, i.e. the first insulating areas 134 forms an insoluble and not-conductive $Ag_2S$.

The oxidation is carried out after pattern masking; and then the metal mesh 132a is placed in an environment containing the $H_2S$, the insulating area of the conductive layer is not needed to etch, thus the problem of producing lots of wastewater of the metal salts during the etching process can be solved, and heavy metal pollution can be avoided. Moreover, the metal mesh 134a of the first insulating area is oxidized to metal sulfide; thereby, the insulating mesh 134a is formed, thus it helps to reach a uniform transmittance of the touch screen. It can also avoid the alternating light and dark color patches formed by the conductive areas and the insulating areas, cooperatively; thus improving the user experience. The protective layer can be removed by existing processes.

Figure 11:
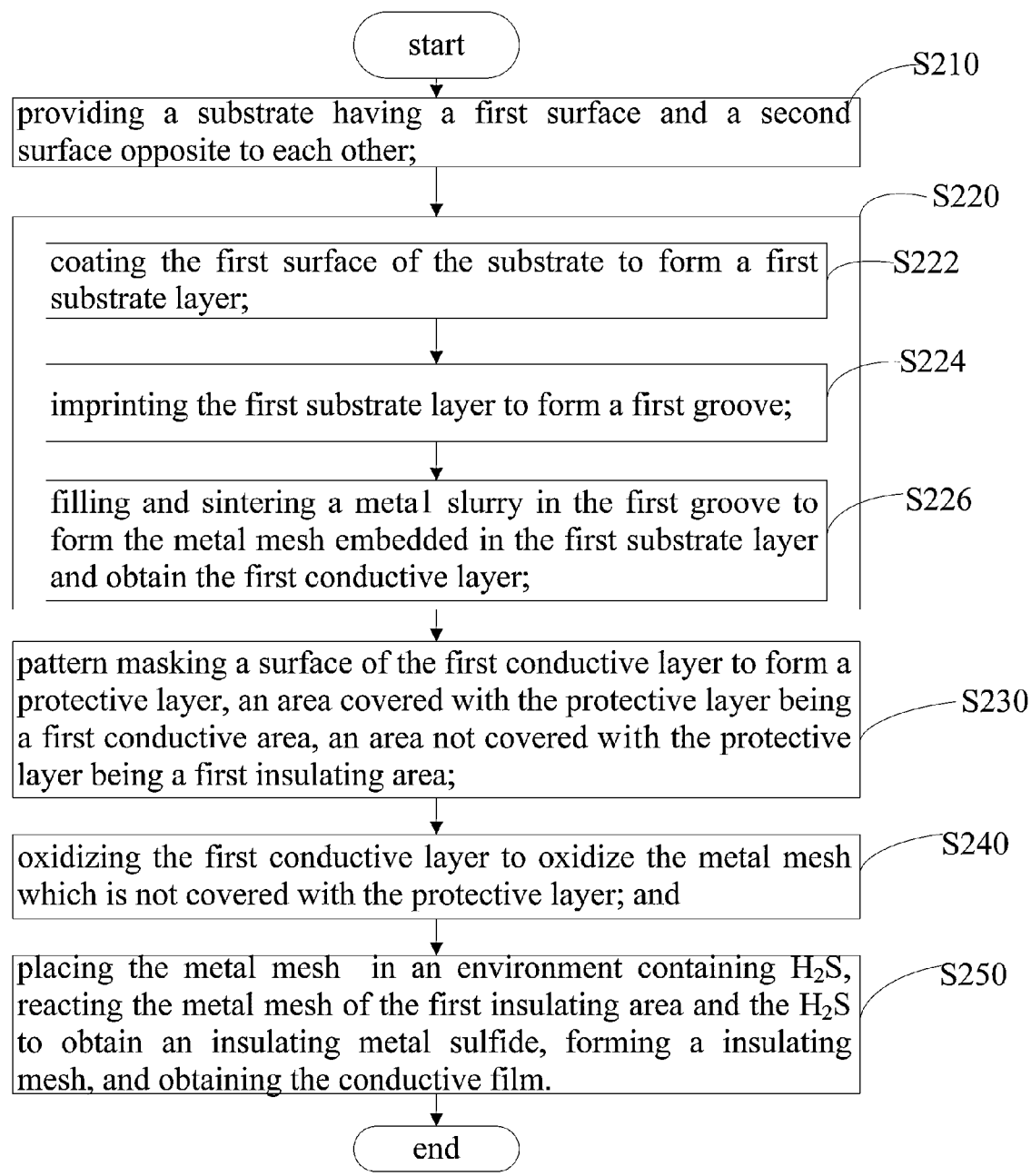
FIG. 11 is a flowchart of a method for manufacturing the conductive according to the second embodiment.

Referring to FIG. 11, the method for manufacturing a conductive film according to the second embodiment includes the following steps of:

Step S210, the substrate 110 is provided. The substrate 110 has a first surface 112 and a second surface 114 opposite to each other.

Step S220, a metal mesh 132a is disposed on the first surface 112 of the substrate 110 to form a first conductive layer 130. Which specifically includes the following steps of: Step S222, the first surface 112 of the substrate 110 is coated to form the first substrate layer 120.

Step S224, the first substrate layer 120 is imprinted to define the first groove 140.

Step S226, the first groove 140 is filled with metal slurry which is sintered to form the metal mesh embedded in the first substrate layer 120, and the first conductive layer 130 is obtained.

Step S230, the first conductive layer 130 is pattern masked to form a protective layer on a surface thereof, an area covered with the protective layer forms the first conductive areas 132, an area not covered with the protective layer forms a first insulating areas 134. The first conductive areas 132 and the first insulating area 134 are formed on the surface of the first conductive layer 130. The graphics of diamond mesh, square mesh, rectangular mesh and others can be formed after the patterning.

Step S240, the first insulating area 134 that is the first conductive layer not covered with the protective layer, is oxidized by an oxidation reaction.

Step S250, in an environment containing the $H_2S$, the first insulating area 134 of the first conductive layer 130 not covered with the protective layer and $H_2S$ react to obtain a non-conductive insulating metal sulfide, the conductive film having the first insulating areas 134 formed by the non-conductive insulating mesh 134a is obtained, i.e. the first insulating area 134 forms an insoluble and not-conductive $Ag_2S$.

In the illustrated embodiment, the step S210, S230, S240 and S250 of the method for manufacturing the conductive film are the same as the step S110, S130, 140 and S150 in the first embodiment, the step S224 and step S226 are the same as the step S122 and step S124 in the first embodiment, which will not described in detail.

The oxidation is carried out after pattern masking; and then the metal mesh 132a is placed in an environment containing the $H_2S$, the unnecessary insulating area of the conductive layer is not needed to etch, thus the problem of producing lots of wastewater of the metal salts during the etching process can be solved, and heavy metal pollution can be avoided. Moreover, the metal mesh 134a of the first insulating area is oxidized to metal sulfide, and the insulating mesh 134a is formed. It helps to reach a uniform transmittance of the touch screen. It can avoid the alternating light and dark color patches formed by the conductive areas and the insulating areas, cooperatively; thus improving the user experience.

Figure 12:
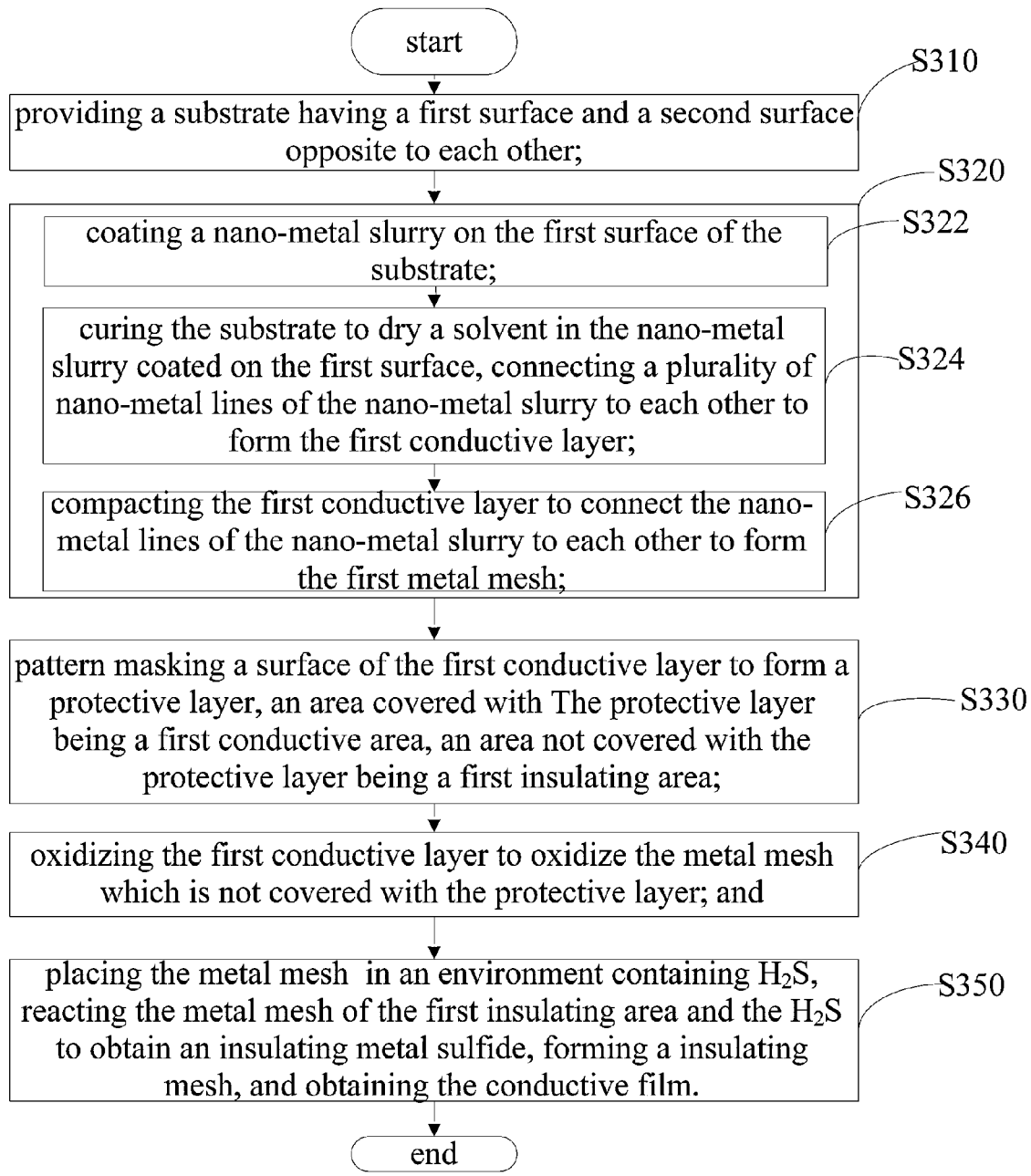
FIG. 12 is a flowchart of a method for manufacturing the conductive according to the third embodiment.

Referring to FIG. 12, the method for manufacturing a conductive film according to the third embodiment includes the following steps of:

Step S310, the substrate 110 is provided. The substrate 110 has a first surfacen 112 and a second surface 114 opposite to each other.

Step S320, a metal mesh 132a is laid on the first surface 112 of the substrate 110 to form a first conductive layer 130. Which specifically includes the following steps of: Step S222, the first surface 112 of the substrate 110 is coated with nano-metal slurry. Specifically, the substrate 110 is coated with nano-silver ink, the nano-silver ink is formed by a nano-silver material and hydrophilic solvent, the solute is a silver line with a diameter of 20 nm to 40 nm and a length of 10 microns to 20 microns.

Step S324, the first substrate layer 120 is cured, such that the metal slurry is dried and the plurality of the nano-metal lines of the nano-metal slurry are connected to each other, the first conductive layer is formed. The metal lines are the nano silver lines, and the silver lines are intercrossed to each other.

Step S326, the first conductive layer 120 is compacted to connect the nano-metal lines of the nano-metal slurry to each other to form the first metal mesh 132a, any pattern can be formed.

Step S330, a surface of the first conductive layer 130 is pattern masked to form a protective layer, an area covered with the protective layer forms the first conductive areas 132; an area not covered with the protective layer forms the first insulating area 134. The first conductive areas 132 and the first insulating area 134 are disposed on the surface of the first conductive layer 130. The graphics of diamond mesh, square mesh, rectangular mesh and others can be formed after the patterning.

Step S340, the first insulating area 134 that is the first conductive layer not covered with the protective layer, is oxidized by an oxidation reaction.

Step S350, in an environment containing the $H_2S$, the first insulating area 134 of the first conductive layer 130 not covered with the protective layer and $H_2S$ react to obtain a non-conductive insulating metal sulfide, the conductive film with the first insulating areas 134 formed by the non-conductive insulating mesh 134a is obtained, i.e. the first insulating areas 134 forms an insoluble and not-conductive $Ag_2S$.

In the illustrated embodiment, the step S310, S330, S340 and S350 of the method for manufacturing the conductive film are the same as the step S110, S130, S140 and S150 in the first embodiment, which will not described in detail.

The oxidation is carried out after pattern masking; and then the metal mesh 132a is placed in an environment containing the $H_2S$, the insulating area of the conductive layer is not needed to etch, thus the problem of producing lots of wastewater of the metal salts during the etching process can be solved, and heavy metal pollution can be avoided. Moreover, the metal mesh of the insulating area is oxidized to metal sulfide mesh. It helps to reach a uniform transmittance of the touch screen. It can avoid the alternating light and dark color patches formed by the conductive areas and the insulating areas, cooperatively; thus improving the user experience.

Figure 13:
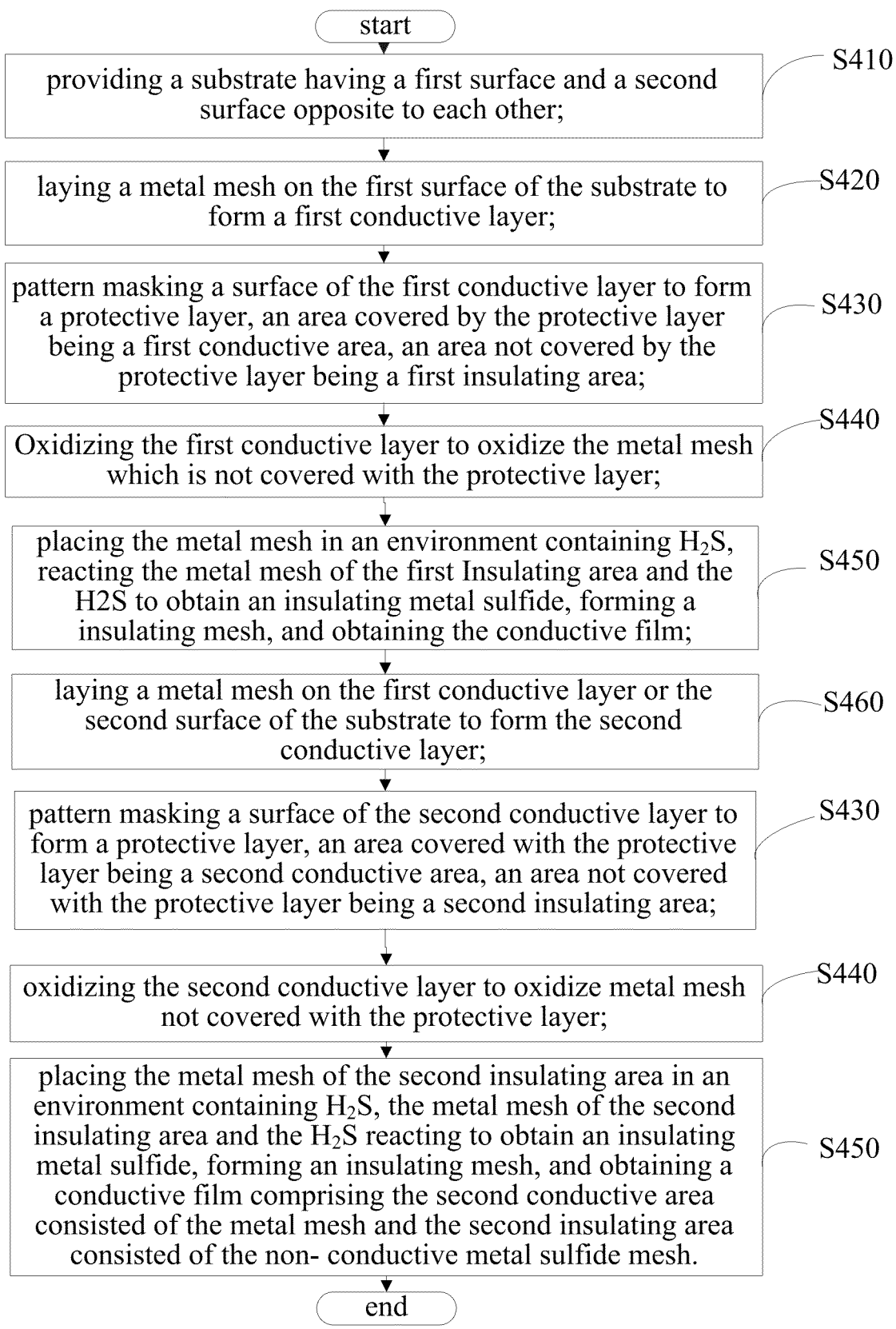
FIG. 13 is a flowchart of a method for manufacturing the conductive according to the fourth embodiment.

Referring to FIG. 13, in the fourth embodiment, the method for manufacturing a conductive film includes the step of forming the second conductive layer, specifically includes the following steps of:

Step S410, the substrate 110 is provided. The substrate 110 has a first surface 112 and a second surface 114 opposite to each other.

Step S420, a metal mesh 132a is laid on the first surface 112 of the substrate 110 to form a first conductive layer 130. It is the same as the step S120 in the first embodiment, the step S220 in the second embodiment and the step S320 in the third embodiment, which will not described in detail.

Step S430, the first conductive layer 130 is pattern masked to form a protective layer on a surface thereof, an area covered with the protective layer is the first conductive areas 132, an area not covered with the protective layer is the first insulating area 134. The first conductive areas 132 and the first insulating area 134 are formed on the surface of the first conductive layer 130. The graphics of diamond mesh, square mesh, rectangular mesh and others can be formed after the patterning.

Step S440, the first insulating area 134 that is the first conductive layer not covered with the protective layer, is oxidized by an oxidation reaction.

Step S450, in an environment containing the $H_2S$, the first insulating area 134 of the first conductive layer 130 not covered with the protective layer and $H_2S$ react to obtain a non-conductive insulating metal sulfide, the conductive film with the first insulating areas 134 formed by the non-conductive insulating mesh 134a is obtained, i.e. the first insulating areas 134 forms an insoluble and not-conductive $Ag_e$ S Step S460, the metal mesh 132a is disposed on the surface of the first conductive layer 130 or the second surface 114 of the substrate 110 to form the second conductive layer 230, i.e. the second conductive layer 230 can be disposed on the surface of the first conductive layer 130, or the second surface 114 of the substrate 110. The structure of the second conductive layer 230 is the same as that of the first conductive layer 130.

Repeating Step S430, a surface of the second conductive layer 230 is pattern masked to form a protective layer, an area covered with the protective layer is the second conductive areas 232, an area not covered with the protective layer is the second insulating areas 234. The second conductive areas 232 and the second insulating areas 234 are formed on the surface of the second conductive layer 230. The graphics of diamond mesh, square mesh, rectangular mesh and others can be formed after the patterning.

Step S440, the second insulating areas 234 that is the second conductive layer not covered with the protective layer, is oxidized by an oxidation reaction.

Step S450, in an environment containing the $H_2S$, the second insulating areas 234 of the second conductive layer 230 not covered with the protective layer and $H_2S$ react to obtain to a non-conductive insulating metal sulfide, the conductive film with the second insulating areas 234 formed by the non-conductive insulating mesh 134a is obtained.

In the illustrated embodiment, the step S410 to S450 of the method for manufacturing the conductive film is the same as the step S110 to S150 in the first embodiment or the step S210 to S250 in the second embodiment, which will not described in detail.

In the described embodiments, an oxidation of the first conductive layer 130 and the second conductive layer 230 after the pattern masking includes: the first conductive layer 130 and the second conductive layer 230 are placed in an oxidizing atmosphere. The oxidizing atmosphere is selected from the group consisted of hydrogen peroxide, dilute nitric acid, hot concentrated sulfuric acid, and hydrochloric acid. Or an oxidation of the first conductive layer 130 and the second conductive layer 230 after the pattern masking includes: the first conductive layer 130 and the second conductive layer 230 are coated with an oxidizing material; the first insulating areas 134 and the second insulating areas 234 are formed.

The protective layer can be formed by coating a photoresist, ink-jet printing or pattern screen printing.

It should be understood that the descriptions of the examples are specific and detailed, but those descriptions can't be used to limit the present disclosure. Therefore, the scope of protective of the disclosure patent should be subject to the appended claims.

What is claimed is:

1. A conductive film, comprising:
   a substrate having a first surface and a second surface opposite to each other; and
   a first conductive layer disposed on the first surface of the substrate, the first conductive layer comprising a plurality of first conductive areas and a plurality of first insulating areas, one of the first insulating areas being located between two adjacent first conductive areas, the first conductive areas comprising a metal mesh formed by a metal, the first insulating areas comprising an insulating mesh formed by an insulating metal sulfide, wherein the insulating metal sulfide is obtained from a reaction between the metal and hydrogen sulfide.

2. The conductive film according to claim 1, wherein the first conductive layer is directly positioned on the first surface of the substrate.

3. The conductive film according to claim 2, wherein the first surface of the substrate is provided with a first substrate layer, the first conductive layer is embedded in the first substrate layer.

4. The conductive film according to claim 3, wherein the first substrate layer defines a first groove on a surface thereof away from the substrate, the first conductive layer is received in the first groove.

5. The conductive film according to claim 2, wherein the first surface of the substrate defines a first groove, the first conductive layer is received in the first groove.

6. The conductive film according to claim 1, wherein the first conductive area comprises a first axial conductive column and a second conductive column, the first axial conductive column comprises a first axial conductive unit and a first connecting portion electrically connected to the first axial conductive unit, the second conductive column comprises a second axial conductive unit and a second connecting portion electrically connected to the second axial conductive unit, an insulation element is disposed between the first connecting portion and the second connecting portion, the first connecting portion is insulated to the second connecting portion via the insulation element.

7. The conductive film according to claim 1, further comprising a second conductive layer, the second conductive layer and the first conductive layer being spaced and insulated from each other in the thickness direction of substrate, wherein the second conductive layer comprises a plurality of second conductive areas and a plurality of second insulating areas, one of the second insulating areas is located between two adjacent second conductive areas, the second conductive area comprises a metal mesh formed by metal, the second insulating area comprises an insulating mesh formed by the insulating metal sulfide, the insulating metal sulfide is obtained from a reaction between the metal and hydrogen sulfide.

8. The conductive film according to claim 7, further comprising a second substrate layer embedded in the second substrate layer.

9. The conductive film according to claim 8, wherein the first conductive layer is covered with the second substrate layer located between the first conductive layer and the second conductive layer; the second substrate layer, the first conductive layer and the second conductive layer are located at the same side of the substrate; a surface of the second substrate layer away from the substrate defines a second groove, the second conductive layer is received in the second groove.

10. The conductive film according to claim 8, wherein the second substrate layer is disposed on the second surface of the substrate, a surface of the second substrate layer away from the substrate defines a second groove; the second conductive layer is received in the second groove.

11. The conductive film according to claim 7, wherein the second surface of the substrate defines a second groove; the second conductive layer is received in the second groove.

12. A touch screen, comprising a transparent panel, an electrode trace, and a conductive circuit, wherein the touch screen further comprises the conductive film according to claim 1, a surface of the first conductive layer is covered with the transparent panel, the electrode trace is connected to the metal mesh of the first conductive area of the first conductive layer, the conductive trace is connected to the electrode trace.

13. A touch screen, comprising a transparent panel, an electrode trace, and a conductive circuit, wherein the touch screen further comprises the conductive film according to claim 7, wherein a surface of the first conductive layer is covered with the transparent panel, the electrode trace comprises a first electrode trace and a second electrode trace, the first electrode trace and the second electrode trace are spaced from each other in the thickness direction of the substrate, the first electrode trace is connected to the metal line of the metal mesh of the first conductive layer, the second electrode trace is connected to the metal line of the metal mesh of the second conductive layer, the conductive trace is connected to the electrode trace.

14. A method for manufacturing a conductive film, comprising the following steps:
   providing a substrate having a first surface and a second surface opposite to each other;
   laying a metal mesh on the first surface of the substrate to form a first conductive layer;
   pattern masking a surface of the first conductive layer to form a protective layer, an area covered with the protective layer being a first conductive area, an area not covered with the protective layer being a first insulating area;
   oxidizing the first conductive layer to oxidize the metal mesh which is not covered with the protective layer; and
   placing the metal mesh in an environment containing $H_2S$, reacting the metal mesh of the first insulating area and the $H_2S$ to obtain an insulating metal sulfide, forming a insulating mesh, and obtaining the conductive film.

15. The method for manufacturing the conductive film according to claim 14, wherein the formation of the metal mesh comprises the following steps:
   imprinting the substrate to form a first groove;
   filling a metal slurry in the first groove and sintering to form the metal mesh and obtain the first conductive layer.

16. The method for manufacturing the conductive film according to claim 14, wherein the formation of the metal mesh comprises the following steps:
   coating the first surface of the substrate to form a first substrate layer;
   imprinting the first substrate layer to form a first groove;

filling and sintering a metal slurry in the first groove to form the metal mesh embedded in the first substrate layer and obtain the first conductive layer.

17. The method for manufacturing the conductive film according to claim 14, wherein the formation of the metal mesh comprises the following steps:
   coating a nano-metal slurry on the first surface of the substrate;
   curing the substrate to dry a solvent in the nano-metal slurry coated on the first surface, connecting a plurality of nano-metal lines of the nano-metal slurry to each other to form the first conductive layer;
   compacting the first conductive layer to connect the nano-metal lines of the nano-metal slurry to each other to form the first metal mesh.

18. The method for manufacturing the conductive film according to claim 14, further comprising a step of laying a second conductive layer after placing the metal mesh in an environment containing $H_2S$, wherein the step of laying the second conductive layer comprises the following steps:
   laying a metal mesh on the first conductive layer or the second surface of the substrate to form the second conductive layer;
   pattern masking a surface of the second conductive layer to form a protective layer, an area covered with the protective layer being a second conductive area, an area not covered with the protective layer being a second insulating area;
   oxidizing the second conductive layer to oxidize metal mesh not covered with the protective layer;
   placing the metal mesh of the second insulating area in an environment containing $H_2S$, the metal mesh of the second insulating area and the $H_2S$ reacting to obtain an insulating metal sulfide, forming an insulating mesh, and obtaining a conductive film comprising the second conductive area consisted of the metal mesh and the second insulating area consisted of the non-conductive metal sulfide mesh.

19. The method for manufacturing the conductive film according to claim 14, wherein an oxidation of the first conductive layer and the second conductive layer after the pattern masking comprises the following steps:
   placing the first conductive layer and the second conductive layer in an oxidizing atmosphere, the oxidizing atmosphere is selected from the group consisted of hydrogen peroxide, dilute nitric acid, hot concentrated sulfuric acid, and hydrochloric acid;
   or coating an oxidizing material on the first conductive layer and the second conductive layer, forming a first insulating area and a second insulating area.

20. The method for manufacturing the conductive film according to claim 14, wherein the protective layer is formed by coating a photoresist, ink-jet printing or pattern screen printing.

* * * * *